United States Patent
Wu

(10) Patent No.: US 6,445,661 B1
(45) Date of Patent: Sep. 3, 2002

(54) CIRCUIT, DISK CONTROLLER AND METHOD FOR CALIBRATING A HIGH PRECISION DELAY OF AN INPUT SIGNAL

(75) Inventor: Eric Shengquan Wu, Sunnyvale, CA (US)

(73) Assignee: Oak Technology, Inc., Sunnyvale, CA (US)

( * ) Notice: Subject to any disclaimer, the term of this patent is extended or adjusted under 35 U.S.C. 154(b) by 0 days.

(21) Appl. No.: 09/372,373

(22) Filed: Aug. 11, 1999

(51) Int. Cl.[7] .................................................. G11B 7/00

(52) U.S. Cl. ...................................... 369/59.2; 327/278

(58) Field of Search .............................. 369/59.2, 59.27; 327/218

(56) References Cited

U.S. PATENT DOCUMENTS

| | | | | |
|---|---|---|---|---|
| 4,737,670 A | * | 4/1988 | Chan | 307/602 |
| 4,845,390 A | * | 7/1989 | Chan | 307/602 |
| 5,216,657 A | * | 6/1993 | Nishiuchi et al. | 369/59.27 |
| 5,220,546 A | | 6/1993 | Fennema | 369/32 |
| 5,237,554 A | * | 8/1993 | Senshu et al. | 369/59.27 |
| 5,272,687 A | * | 12/1993 | Matsushima | 369/59.27 |
| 5,535,327 A | | 7/1996 | Verinsky et al. | 395/182.03 |
| 5,559,458 A | * | 9/1996 | Holler, Jr. | 327/143 |
| 5,581,715 A | | 12/1996 | Verinsky et al. | 395/309 |
| 5,870,363 A | | 2/1999 | Sun et al. | 369/50 |
| 5,986,830 A | * | 11/1999 | Hein | 360/45 |
| 6,025,745 A | * | 2/2000 | Lee et al. | 327/277 |
| 6,064,244 A | * | 5/2000 | Wkayama et al. | 327/158 |
| 6,169,438 B1 | | 1/2001 | Wu et al. | |
| 6,194,937 B1 | * | 2/2001 | Minami | 327/270 |

FOREIGN PATENT DOCUMENTS

EP      687064 A1 * 12/1995

OTHER PUBLICATIONS

"The Compact Disk Handbook", 2nd edition, by Ken C. Pohlmann, pp. 86–89 (1992).
"Philips Consumer Electronics–Compact Disk: *Nothing is Impossible*", http://www–us.sv.philips.com/newtech/cd.html, pp. 1–26 (May 12, 1999).
"*Compact Disc Pickup Designs*", by Cho Leung Chan, http://www.ee.washington.edu/conselec/W94/cho/chocd.htm, pp. 1–6 (May 12, 1999).
"GIF Image 669×459 pixels", http://www.ee.washington.edu/conselec/W94/cho/cho03.gif, , (May 12, 1999).
"OTI–9780: Preliminary Product Brief", http://www.oak-tech.com/briefs/9780.htm, pp. 1–2 (7/98).
"OTI–9780 Product Brief: *Technical Specifications*", http://www.oaktech.com/briefs/978tech.htm, pp. 1–2 (Mar. 12, 1999).
"OTI–975: *IDE CD Recordable/ReWritable Controller*", http://www.oaktech.com/briefs/975.htm, pp. 1–2 (Mar. 12, 1999).
"*GIF Image*", htt://www.oaktech.com/images/975.gif (Mar. 12, 1999).
"OTI–912: *IDE CD–ROM Controller*", http://www.oaktech.com/briefs/912.htm, pp. 1–2 (3/97).

(List continued on next page.)

*Primary Examiner*—Aristotelis M. Psitos
(74) *Attorney, Agent, or Firm*—Pennie & Edmonds LLP

(57) ABSTRACT

In a circuit to provide a high precision delay signal, an oscillator generates oscillator pulses, each with an oscillator period. A counter, in response to an enable signal, counts the oscillator pulses and outputs a count signal. The enable signal is a reference clock signal having a reference-clock period that is greater than the oscillator period. A delay generator delays an input signal to provide a sequence of incrementally delayed delay-signals. A multiplexor, in response to the count signal, selects one of the delayed signals. In another aspect of the invention, a disc controller uses the circuit to provide a high precision delay to a write data signal. Another aspect of the invention provides a method of providing the high precision delay.

12 Claims, 7 Drawing Sheets

OTHER PUBLICATIONS

"*GIF Image*", http://www.oaktech.com/images/912blok.gif, (Mar. 12, 1999).

"*CD–The Inside Story*", by Glen Baddleley, http://werple.net.au/~gnb/mac–cdis/index.html, (Jul. 1, 1998).

"*CD–The Inside Story–Part 1—General Principles*", by Glenn Baddeley, http://werple.net.au/~gnb/mac–cdis/cd.1.html, (Dec. 2, 1996).

"*CD– The Inside Story–Part 2– The Disc*", by Glenn Baddeley, http://werple.net.au/~gnb/mac–cdis/cd2.html, (Dec. 2, 1996).

"*CD–The Inside Story–Part 3– Data Format*", by Glenn Baddeley, http://werple.net.au/~gnb/mac–cdis/cd3.html, pp. 1–2 (Dec. 2, 1996).

"*CD–The Inside Story–Part 4– Sub–code*", by Glenn Baddeley, http://werple.net.au/~gnb/mac–cdis/cd4.html, pp. 1–2 (Dec. 2, 1996).

"*CD–The Inside Story–Part 5– Laser Tracking*", by Glenn Baddeley, http://werple.net.au/~gnb/mac–cdis/cd5.html, pp. 1–4 (Dec. 2, 1996).

"*CD–The Inside Story–Part 7– Digital to Analog Conversion*", by Glenn Baddeley, http://werple.net.au/~gnb/mac–cdis/cd7.html, pp. 1–4 (Dec. 2, 1996).

"*CD–The Inside Story–Part 8– Over–sampling and Filtering*", by Glenn Baddeley, http://werple.net.au/~gnb/mac–cdis/cd8.html, pp. 1–4 (Dec. 2, 1996).

"*CD–The Inside Story–Part 9–Mythology*", by Glenn Baddeley, http://werple.net.au/~gnb/mac–cdis/cd9.html, pp. 1–2 (Dec. 2, 1996).

"*CD–The Inside Story–Postscript & References*", by Glenn Baddeley, http://werple.net.au/~gnb/mac–cdis/cdps.html, pp. 1–2 (Feb. 13, 1998).

"*Audio Compact Disk–An Introduction*", by Professor Kelin J. Kuhn, http://www.ee.washington.edu/conselec/CE/kuhn/cdaudio/95x6.htm, pp. 1–7 (May 12, 1999).

Runout Calibration for Disc Drive System, U.S. patent application, Ser. #08/834,607, (Filed Apr. 14, 1997).

* cited by examiner

Block Diagram of Disk Drive System

Block Diagram of a Disk Drive System

Delay Block

Delay Block

Ring Oscillator

Ring Oscillator

CIRCUIT, DISK CONTROLLER AND METHOD FOR CALIBRATING A HIGH PRECISION DELAY OF AN INPUT SIGNAL

BRIEF DESCRIPTION OF THE INVENTION

This invention relates generally to digital systems. More particularly, this invention relates to a method and apparatus for calibrating a high precision delay.

BACKGROUND OF THE INVENTION

Personal computers typically connect to an optical disk drive such as a CD-ROM to read data from a compact disk. On the compact disk, data is stored in the form of pits and lands patterned in a radial track. The track is formed in one spiral line extending from the inner radius of the disk to the outer edge. A pit is a location on the disk where data has been recorded by creating a depression in the surface of the disk with respect to the lands. The lands are the areas between the pits in the tangential direction. The reflectivity of the pits is less than the reflectivity of the lands. To store audio or digital information, the length of the pits and lands are controlled according to a predefined encoding format.

When reading information from the disc, light from a laser beam is directed onto the track and the light beam is reflected back to a photo-sensor such as a photo-diode. Since the pits and lands have different reflectivity, the amount of reflected light changes at the transitions between the pits and the lands. In other words, the encoded pattern of the pits and lands modulates the reflected light beam. The photo-sensor receives the reflected light beam, and outputs a modulated signal, typically referred to as an RF signal, that is proportional to the energy of the light in the reflected light beam.

In FIG. 1, the relationship of the RF signal to the pits and lands is shown. A smaller pit or land decreases both the period and the amplitude of the RF signal. The RF signal in the pits and lands has opposite polarity.

One encoding format used in optical disk systems is eight-to-fourteen modulation (EFM). EFM reduces errors by minimizing the number of zero-to-one and one-to-zero transitions. In other words, small pits and lands are avoided. A one is indicated by a change in the energy of the reflected light beam, that is, a pit edge. A zero is indicated by no change in the energy reflected beam for at least two clock periods. Applying the EFM encoding rules, a pit or land will have a length corresponding to the amount of time for at least three and up to eleven clock periods and the electronics will output a corresponding voltage as shown in FIG. 1.

The data is written on the disk via the pits and lands using EFM format. Because of the characteristics of the laser, the media and the recording speed, the EFM signal is adjusted by write strategy electronics to generate a high frequency (HF) write signal that is used to modulate the power of the laser. The write strategy electronics generates the signals to control the laser power, in addition to other control signals.

The disks can be played or written at different speeds. Therefore, the EFM data needs to be written to the disk at different speeds. As the speed increases, the period of the EFM signal and an associated reference clock signal decreases.

In FIG. 2, an ideal EFM signal corresponding to a pit or mark on the disk is shown. The ideal EFM signal is synchronized to a system clock having a clock period of T. The laser power signal needed to cause the laser to write the ideal EFM signal on the disk is also shown. The write strategy circuit generates additional control signals, EFM1, EFM2 and EFM3 that are supplied to laser interface circuitry that is used to generate the laser power signal. FIG. 2 shows the outputs of EFM1, EFM2 and EFM3 in a CD-Recordable (CD-R) drive. The EFM3 signal controls a low power pre-heat phase of the laser. The EFM2 signal controls the duration of a boost power phase of the laser. The EFM1 signal controls the overall duration of a writing phase of the laser which includes the boost power phase. In the EFM1 signal, the write strategy circuit adjusts the delay $T_d$ and $T_r$ with respect to the rising and falling edges of the ideal EFM signal, respectively, and the system clock. In the EFM2 signal, the write strategy circuit adjusts the duration of the EFM2 pulse Tw with respect to the rising edge of the EFM1 signal. In the EFM3 signal, the write strategy circuit adjusts a delay Th with respect to the ideal EFM signal and the system clock. To write data accurately, each timing parameter, $T_d$, $T_r$, $T_w$ and $T_h$ must be adjusted with very high precision, such as $\frac{1}{32}$ T. In one embodiment, $\frac{1}{32}$ T is equivalent to 0.9 nanoseconds.

One method to delay a signal uses combinational logic to adjust the timing parameters such as the delay $T_d$. One problem with this method is that it is difficult to precisely calculate the exact amount of delay during the design stage. The amount of delay also changes because of process, temperature and power supply variations.

In view of the foregoing, it would be highly desirable to provide a method and apparatus that precisely delays an input signal for a desired amount of time. The method and apparatus should also provide a stable and precise amount of delay that accommodates process, temperature and power supply variations. Such a circuit would reduce timing problems in digital environments requiring high precision delays, such as in CD-ROM drives, CD-R and CD-Rewritable (CD-RW) drives.

SUMMARY OF THE INVENTION

A circuit provides a predetermined amount of high precision delay under temperature, power supply and process variations. An oscillator generates oscillator pulses, each with an oscillator period. A counter, in response to an enable signal, counts the oscillator pulses and outputs a count signal. The enable signal is a reference clock signal having a reference-clock period that is greater than the oscillator period. A delay generator delays an input signal to provide a sequence of incrementally delayed delay-signals. A multiplexor, in response to the count signal, selects one of the delayed signals.

In another aspect of the invention, a disc controller uses the circuit to provide a high precision delay to a write data signal to control laser power. Another aspect of the invention provides a method of providing the high precision delay.

In this way, by allowing the count signal to increase or decrease with the speed of the oscillator, the invention provides substantially the same amount of delay to the input signal under temperature, power supply or process variations.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

Figure 3:
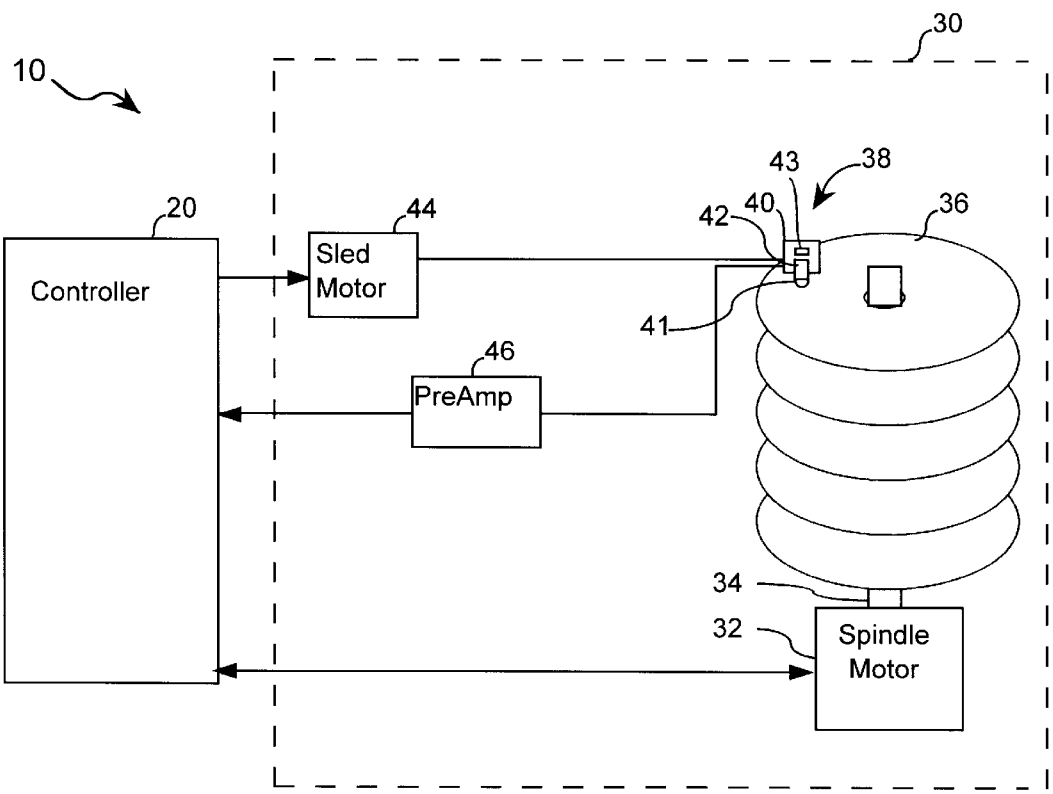
FIG. 3 illustrates a general architecture of a disk drive system in accordance with an embodiment of the present invention.

In FIG. 3, a disk drive system 10 has a controller unit 20 that connects to a disk drive 30, such as an optical disk drive. In the optical disk drive 30, a spindle motor 32 is attached to a spindle 34 which supports at least one disk 36. In response to commands from the controller unit 20, the spindle motor 32 rotates the spindle 34 and therefore the disks 36.

While the disk 36 is rotating, an optical head assembly 38 reads information from or writes information to the disk 36. The optical head assembly 38 includes a sled carriage 40, a lens 41, an actuator 42 and a photo-sensor 43. The sled carriage 40 supports the photo-sensor 43 and the actuator 42. The actuator 42 is a voice coil motor that supports and positions the lens 41. The lens 41 transmits a light beam from a laser diode to the disk surface 36 and transmits the reflected light beam from the disk surface 36 to the photo-sensor 43. The sled motor 44 moves the optical head assembly 38 including the actuator 42 to position the optical head assembly 38 with respect to a target track on the disk 36. The actuator 42 finely positions the lens 41 over the target track's centerline.

A preamplifier 46 receives the analog RF signal from the head 38 and outputs an analog read channel signal.

Figure 4:
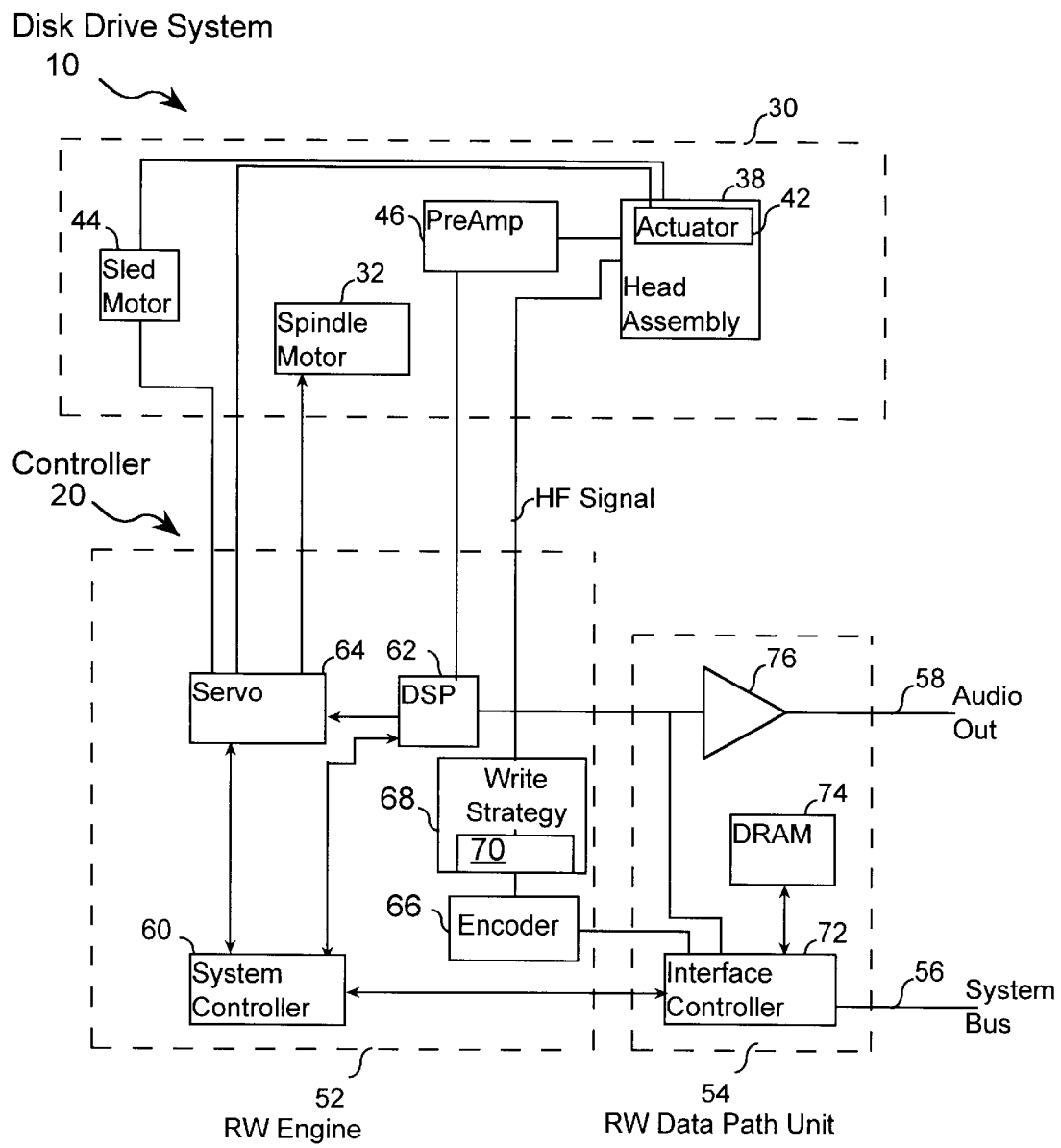
FIG. 4 illustrates a general architecture of a disk controller in accordance with an embodiment of the present invention.

FIG. 4 is a more detailed block diagram of the disk controller 20 and its associated disk drive 30. The disk controller 20 has a read/write (RW) engine 52 that connects to a read/write data path unit 54. The RW engine 52 communicates directly with the disk drive 30 while the RW datapath unit 54 communicates with a system bus 56 and supplies an audio signal to an audio output line 58.

The RW engine 52 has a system controller 60, a digital signal processor 62 and a servo control unit 64. The system controller 60 receives commands from and sends status to a system bus 56 via the RW datapath unit 54. In response to the commands from the system bus 56, the system controller 60 sends commands to and receives status information from the digital signal processor (DSP) 62 and the servo control unit 64 to read data from or write data to the disk.

The servo control unit 64 positions the head with respect to a target track, and then keeps the head 38 centered and focused on the target track. To do so, the servo control unit 64 receives the control signals from the DSP 62. The servo control unit 64 sends signals to the sled motor 44, actuator 42 and spindle motor 32 to control focusing and tracking. The servo control unit 64 communicates with the spindle motor 32, the actuator 42 and the sled motor 44 to position the optical head 38 precisely to read the desired information from the disk 36.

The DSP 62 receives the analog read channel signal from the preamplifier 46. The analog read channel signal includes both digital data and control information. The DSP 62 processes the analog read channel signal and outputs control signals that are used by the servo control unit 64.

To write data to a disk, an encoder 66 receives data bytes from the read/write data path unit 54, encodes the data bytes and outputs control signals. The encoder 66 encodes the data for a desired speed ranging from 1X to NX.

A write strategy circuit 68 receives the EFM signal and outputs the control signals. Depending on the recording speed and the serial bit pattern being written to disk, the write strategy circuit 68 generates the control signals with respect to the rising and falling edges of the clock signal as described above. In particular, the write strategy circuit 68 includes the high precision delay circuit 70 of the present invention to generate the desired amount of delay. The high precision delay circuit 70 will be further discussed below with reference to FIG. 5.

In the read/write data path unit 54, when writing data to a disk, an interface controller 72 receives the data from the system bus 56, processes the data, and stores the data in the DRAM 74. The interface controller 72 sends the data bytes from the DRAM 74 to the encoder 66.

When reading data from the disk, the interface controller 72 receives the digital data signal from the DSP 62 in a serial stream, descrambles the data, and assembles the data into eight-bit bytes. The interface controller 72 then stores the data into a DRAM 74. The DRAM 74 acts as a buffer for the digital data from the DSP 62. The interface controller 72 also performs error detection and correction operations on the buffered data and transfers the data to the system bus 56.

To provide an audio output, a digital-to-analog converter (DAC) 76 receives the digital data signal from the DSP 62 and outputs an audio signal on the audio output line 58.

Figure 5:
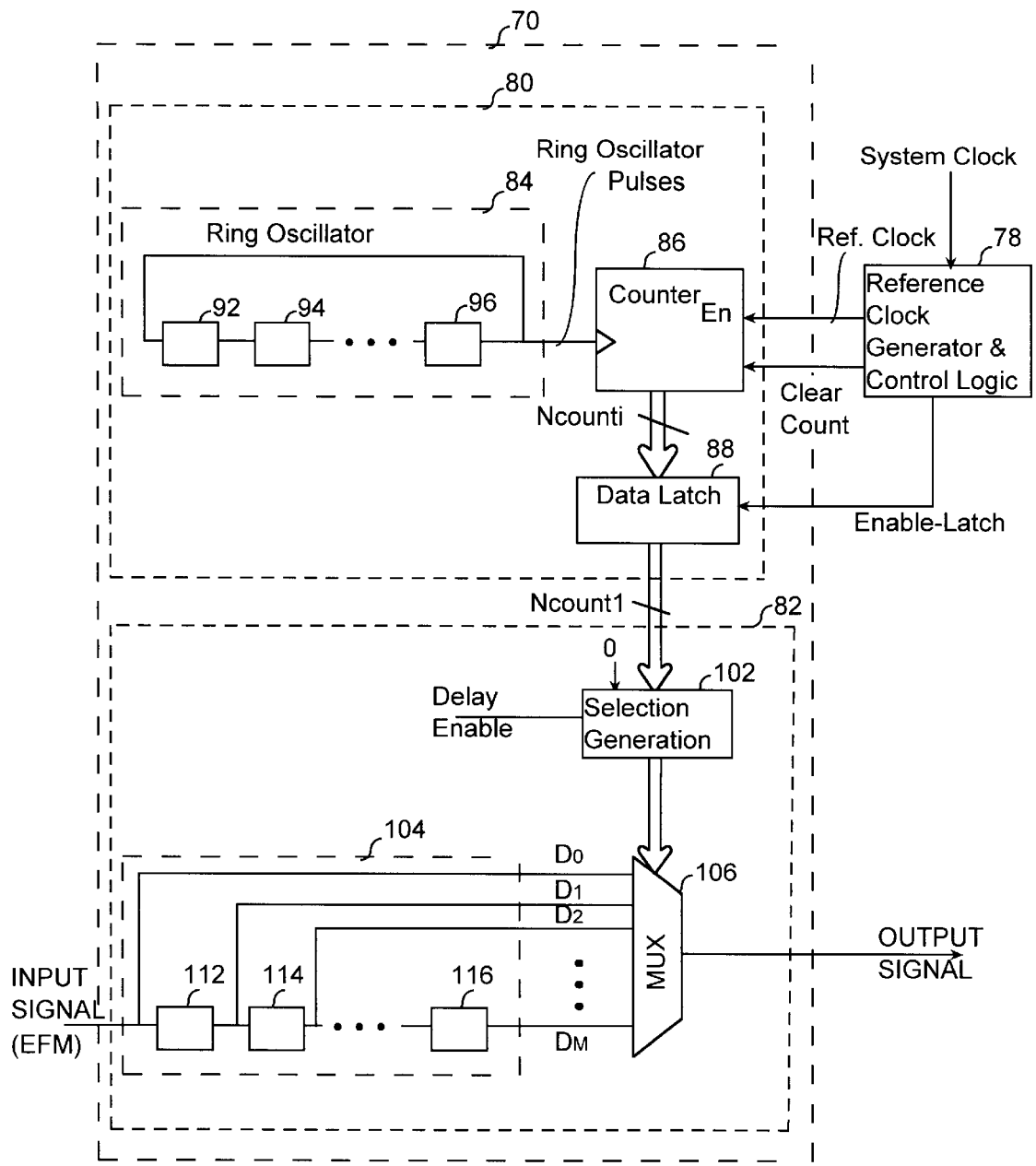
FIG. 5 illustrates a circuit for delaying an input signal with high precision.

In FIG. 5, the high precision delay circuit 70 delays an input signal for a specified amount of time. A reference clock generator and control logic (RCG) 78 in the write strategy circuit (68, FIG. 4) supplies a reference clock signal (Ref. Clock) and control signals to the delay circuit 70. The reference clock signal has an enabling interval which specifies the desired amount of delay. The delay circuit 70 includes a delay calibration block 80 and a gate delay block 82. The delay calibration block 80 digitally measures an accurate time interval which specifies the desired amount of delay and outputs a first count signal, Ncount1. The gate delay block 82 delays the input signal in response to the first count signal, Ncount1.

The delay calibration block 80 includes an oscillator 84, a counter 86 and a latch 88. The oscillator 84 generates oscillator pulses, and each oscillator pulse has a period of Tro. The oscillator 84 is a ring oscillator having one or more ring oscillator delay blocks 92, 94, 96. The ring oscillator delay blocks 92–96 are the same.

The counter 86, in response to an enable signal from the RCG 78, counts the oscillator pulses and outputs an intermediate count signal Ncount1. The enable signal is the reference clock signal with a period Tref, and has an enabling interval Tenb. The counter 86 counts oscillator pulses during the enabling interval Tenb of the reference clock signal. The period of the reference clock signal is greater than the period of the ring oscillator pulses Tro. In other words, the oscillator pulses have a higher frequency than the reference clock signal. The enabling interval Tenb is also greater than the period of the ring oscillator pulses Tro.

A data latch 88 isolates the gate delay block 82 from changes in the intermediate count signal Ncounti when the counter 86 is enabled and counting oscillator pulses. After the counting is complete, in response to an Enable-Latch signal from the RCG 78, the data latch 88 stores the intermediate count signal Ncounti from the counter 86 and outputs the same signal as a latched-count signal Ncount1.

The gate delay block 82 includes a selection generation block 102, a delay generator 104 and a delay selection multiplexor 106. The selection generation block 102 is used to generate select signals for the delay selection multiplexor 106. When the delay enable signal is low, the delay selection multiplexor 106 selects the input signal $D_0$. When the delay enable signal is high, the delay selection multiplexor selects one of the delayed signals $D_1$–$D_M$ according to the value of Ncount1.

The delay generator 104 has one or more delay generator delay blocks 112, 114, 116 connected in series. The delay generator delay blocks 112–116 are the same. The delay generator 104 receives and delays an input signal. In the delay generator 104, the delay generator delay blocks 112–116 incrementally increase the amount of delay to the input signal to generate a set of delayed signals $D_0$–$D_M$. Preferably, the delay generator delay blocks 112–116 are the same as the ring oscillator delay blocks 92–96. Therefore, the delay generator delay blocks 112–116 have the same amount of delay as the ring oscillator delay blocks 92–96, respectively.

The delay selection multiplexor 106, in response to the latched-count signal Ncount1 and the delay enable signal, selects one of the delayed signals from the set of delayed signals for output.

In a noteworthy aspect of the invention, the first count signal Ncount1 varies to cause the delay selection multiplexor 106 to select the output from different delay generator delay blocks to accommodate for process, temperature and power supply variations. In particular, the amount of delay of the ring oscillator delay blocks 92–96 and the delay generator delay blocks 112–116 changes with temperature, process and power supply variations causing the period of the ring oscillator pulses Tro and the amount of delay provided by the delay generator 104 to change. The first count signal Ncount1 will have a higher or lower value depending on the period of the ring oscillator pulses Tro. Since the delay generator delay blocks 112–116 are the same as the ring oscillator delay blocks 92–96, the delay generator delay blocks 112–116 will have substantially the same temperature, process and power supply variations as the ring oscillator delay blocks 92–96. Because the invention allows the first count signal Ncount1 to vary, the invention compensates for changes process, temperature and power supply variations by selecting different numbers of delay generator delay blocks thereby delaying the input signal by substantially the same amount of delay.

For example, when the amount of delay from each delay generator delay block 112–116 is reduced, the period of the ring oscillator pulses is also reduced, the speed of the ring oscillator 84 increases, and the first count signal Ncount1 will have a higher value. In response to the increased count, a delayed signal that passes through more delay blocks will be selected. Each increment of the first count signal Ncount1 adds a delay of one additional delay block with respect to a nominal designed value of the first count signal Ncount1. The nominal design value is the value of the first count signal Ncount1 when not experiencing process, temperature and power supply variations. If the ring oscillator 84 speeds up and adds an additional increment to the first count signal Ncount1, the delay of the delay generator delay blocks 112–114 will also be decreased. To compensate, the multiplexor 106 selects the delayed signal that passes through one additional delay generator delay block to provide substantially the same nominal amount of delay.

Conversely, when the period of the ring oscillator pulses increases and the speed of the ring oscillator 84 decreases, the first count signal Ncount1 will have a lower value, and a delayed signal that passes through fewer delay generator delay blocks 112–116 will be selected. In this case, the delay generator delay blocks will have an increased delay, therefore the multiplexor 106 outputs a delayed signal that provides substantially the same amount of delay as the nominal delay.

Figure 6:
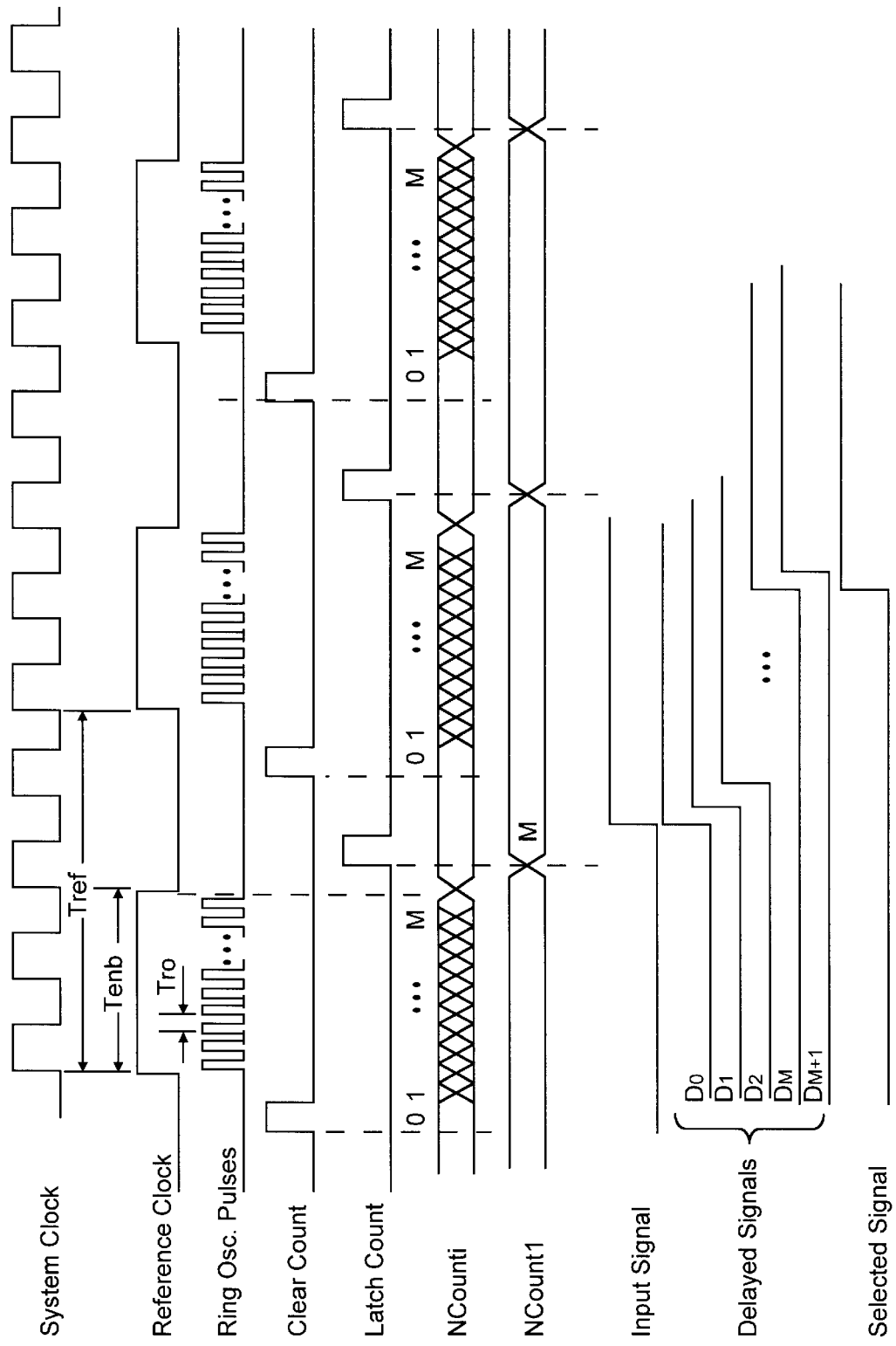
FIG. 6 is a timing diagram demonstrating the operation of the circuit of FIG. 5.

Referring both to FIGS. 5 and 6, a timing diagram of the delay generator 70 of FIG. 5 is shown. A system clock is supplied to the RCG 78. The RCG 78 outputs a reference clock signal that is synchronized to the system clock. The reference clock signal has a period Tref and the enabling interval is Tenb. The ring oscillator pulses are generated during the enabling interval and have a period of Tro.

The RCG 78 supplies a clear count signal to reset the counter 86 and the intermediate count signal Ncounti has a value of zero. After clearing the counter 86, the reference clock signal becomes active, the counter 86 counts the ring oscillator pulses, and the intermediate count signal Ncounti changes from a value of zero to a value of M. The counter 86 stops counting when the reference clock signal transitions low. After the reference clock signal transitions low, the RCG 78 outputs the Enable-latch signal to cause the data latch 102 to store the value of the intermediate count signal Ncounti in the data latch 102 as the latched-count signal Ncount1.

The input signal to be delayed is also synchronized to the system clock signal. The input signal flows through the series of delay generator delay blocks which generate the set of delayed signals $D_0$–$D_{M+1}$. In this example, the latched-count signal Ncount1 has a value of M; therefore, the multiplexor 106 selects the $M^{th}$ delayed signal DM for output.

Referring back to FIG. 5, to design the delay circuit 70, the number of ring oscillator delay blocks 92–96 are chosen such that the enabling interval of the reference clock Tenb is subdivided. The period of the ring oscillator Tro pulses is determined according to relationship one below:

$$Tro = 2 \cdot Nro \cdot Td \qquad (1)$$

where

Nro is the number of ring oscillator delay blocks, and

Td is the amount of delay provided by each ring oscillator delay block.

Assuming that the reference clock has a fifty percent duty cycle, the counter 86 will be enabled for an interval equal to one-half of the period of the reference clock Tref. Therefore, the counter 86 will count ring oscillator pulses for a period of time equal to one-half of the reference clock signal Tref. Relationship two below shows the relationship between the enabling interval Tenb and the number of ring oscillator pulses counted by the counter:

$$Tenb = \frac{1}{2} \cdot Tref = Ncount1 \cdot Tro \qquad (2)$$

By substitution, combining relationships one and two, relationship three below represents the amount of delay of the ring oscillator delay blocks 92–96.

$$Td = \frac{Tref}{4 \cdot Ncount1 \cdot Nro} \qquad (3)$$

Rewriting relationship three, the reference clock period is represented in relationship four below:

$$Tref = 4 \cdot Ncount1 \cdot Nro \cdot Td \qquad (4)$$

Note that the clock period of the reference clock Tref is known in the design stage of the circuit. A nominal design value for the amount of delay Td for the ring oscillator delay blocks is known for a nominal set of process, temperature and power supply design parameters. However, the amount of delay Td of the ring oscillator delay blocks will change from the nominal designed value because of process, temperature and power supply voltage variations during circuit operation.

By definition, the desired amount of delay T of an input signal is equal to the reference clock period Tref divided by a desired fractional amount of delay N (Tref/N). Therefore, based on relationship four, relationship five below represents the desired amount of delay T:

$$T = \frac{Tref}{N} = \frac{(4 \cdot Ncount1 \cdot Nro)}{N} \cdot Td \qquad (5)$$

For example, a desired amount of delay T is equal to 1/32 of the period of the system clock $T_{SYSTEM}$ as follows:

$$T = T_{SYSTEM}/32. \qquad (6)$$

The reference clock is generated from the system clock by dividing the system clock by four and has the following relationship with respect to the system clock:

$$T_{SYSTEM} = Tref/4 \qquad (7)$$

Therefore, combining relationships six and seven with relationship five yields the following relationship:

$$T = \frac{Tref}{128} = \frac{(4 \cdot Ncount1 \cdot Nro)}{128} \cdot Td \qquad (8)$$

Choosing the number of ring oscillator delay blocks Nro to be equal to sixteen, results in the following relationship:

$$T = \frac{Tref}{128} = \frac{(Ncount1)}{2} \cdot Td \qquad (9)$$

Relationship nine implies that (Ncount1/2) delay generator delay cells will provide a delay of T. In particular, for a system clock operating at 34 MHz, the period of the system clock, $T_{SYSTEM}$ will be equal to approximately 28 nanoseconds (ns), and the desired delay T will be equal to approximately 0.9 ns. For example, the delay generator delay cells provide a delay of approximately 0.11 nanoseconds and eight delay generator delay cells provide the desired delay when Ncount1 is equal to sixteen.

However, the value of the first count signal Ncount1 will change during the operation of the delay circuit 70. Therefore, additional delay generator delay blocks are needed to compensate for increases in the speed of the ring oscillator due to process, temperature and power supply variations. In one implementation, the number of delay generator delay blocks is increased by fifty percent. Using the example above, since eight delay generator delay blocks are needed to provide the desired delay, twelve delay generator delay blocks would be used in the implementation to accommodate process, power supply and temperature variations.

Figure 7A:
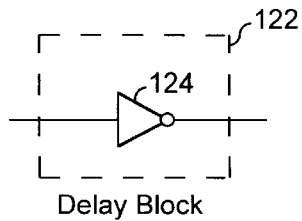
FIG. 7A illustrates one embodiment of a delay block of the circuit of FIG. 5.

In FIG. 7A, an exemplary delay block 122 includes a single inverter 124. The delay block 122 is used as the ring oscillator delay blocks 92–96 and as the delay generator delay blocks 112–116.

Figure 7B:
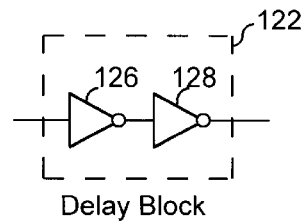
FIG. 7B illustrates another embodiment of the delay block of the circuit of FIG. 5.

In FIG. 7B, in an alternate embodiment, the exemplary delay block 122 has two inverters 126, 128. In this embodiment, the delay block 122 effectively functions as a buffer that delays a signal, and does not invert the signal. Using the delay block of FIG. 7B, the ring oscillator includes only buffers. However, to oscillate, the ring oscillator needs at least one or an odd number of signal inversions.

Figure 8:
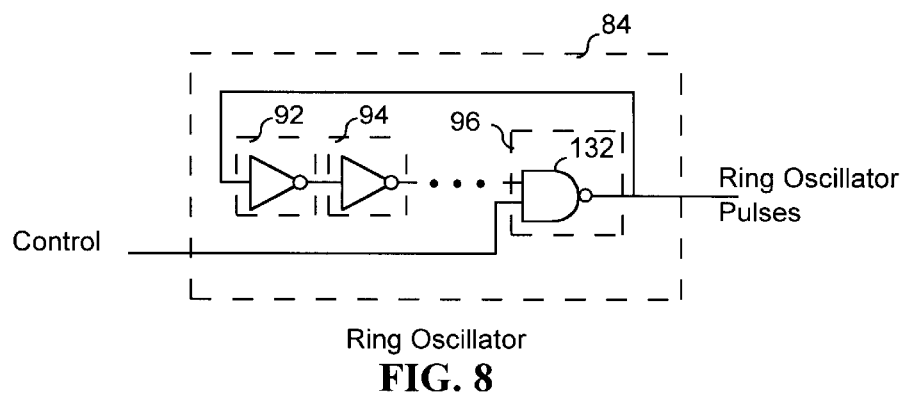
FIG. 8 illustrates an alternate embodiment of the ring oscillator of FIG. 5.

As shown in FIG. 8, in another embodiment of the ring oscillator 84, the last ring oscillator delay block 96 is implemented as a NAND gate 132 to provide a signal inversion. Although the amount of delay provided by the NAND gate 132 is different from the amount of delay of the delay block 122, this difference is very small when the number of ring oscillator delay blocks Nro is large. In other words, the amount of delay provided by the NAND gate 132 is substantially equal to the amount of delay of the delay block 122. In addition, a control signal is attached NAND gate 132 to prevent the ring oscillator 84 from oscillating when the control signal has a digital low voltage level.

Figure 9:
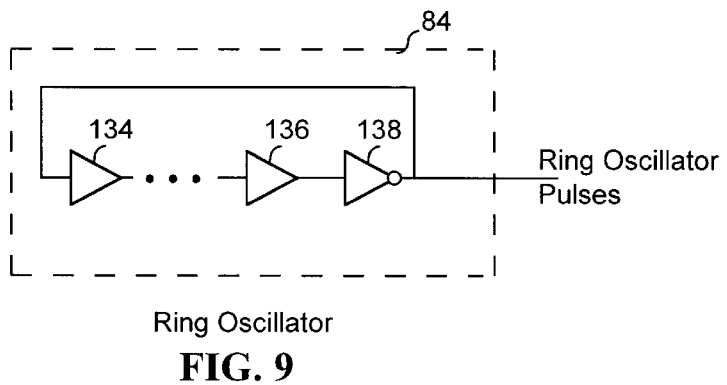
FIG. 9 illustrates another alternate embodiment of the ring oscillator of FIG. 5.

In FIG. 9, in another alternate embodiment, the ring oscillator 84 has sixteen delay blocks including a set of buffer type delay blocks 134–136 of FIG. 7B with one single inverter delay block 138 of FIG. 7A.

In another implementation, the ring oscillator has sixteen buffer type delay blocks and a single NAND gate. The fractional delay N is equal to sixteen. The reference clock operates at thirty-four Megahertz, Ncount1 has four bits, and the delay generator has thirteen delay generator delay blocks.

Figure 10:
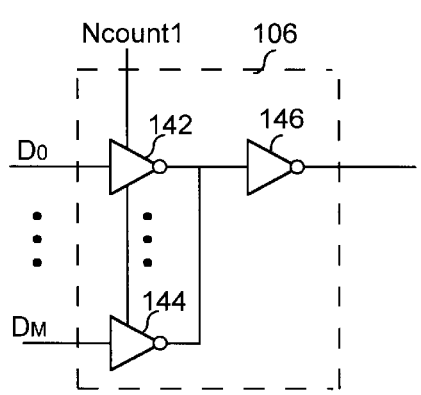
FIG. 10 illustrates an alternate embodiment of the multiplexor of FIG. 5.

In FIG. 10, in an alternate embodiment, tri-state inverters 142–144 are used to implement the multiplexor 106. The delayed signals Do–DM are input to the tri-state inverters 142–144, respectively, the outputs of the ti-state inverters 142–144 are connected together, and supplied to a driver inverter 142. Each of the tri-state inverters 142–144 is enabled by a particular unique value of the latched-count signal, Ncount1.

Figure 11:
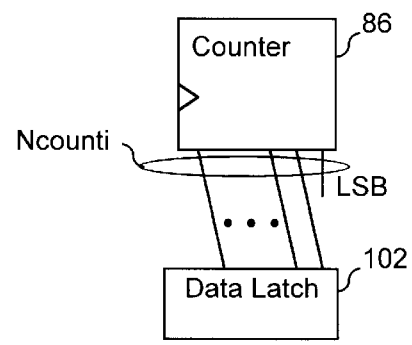
FIG. 11 illustrates the provision of a smaller amount of delay using the connections between the counter and the latch in the circuit of FIG. 5.

In FIG. 11, in another noteworthy aspect of the invention, the intermediate count signal Ncounti is used to effectively subdivide the reference clock signal to provide even smaller amounts of delay with high precision and stability under temperature, power supply and process variations. The counter 86 outputs the intermediate count signal Ncounti which includes a plurality of bits. A subset of the bits are stored in the data latch 88 for input to the selection generation block 102 such that the enabling interval of the reference clock signal is divided. For example, as shown in FIG. 10, the intermediate count signal Ncounti is divided by two by not connecting the least significant bit (LSB) of the intermediate count signal Ncounti to the data latch 88 and connecting the next most significant bit of the intermediate count signal Ncounti to the LSB of the data latch 88. In this way, the multiplexor 106 selects the delayed signal that has an amount of delay equal to one-half the enabling interval of the reference clock signal.

In another alternate embodiment, the intermediate count signal Ncounti is divided by four by not connecting the two LSBs. More generally, the intermediate count signal Ncounti is divided by a factor of $2^n$ by dropping n LSBs.

Because the duration of the enabling interval is digitally measured using the ring oscillator and counter, the selected signal has an amount of delay substantially equal to the enabling interval of the reference clock. To improve precision, the reference clock frequency can be further decreased with respect to the ring oscillator frequency.

Figure 1:
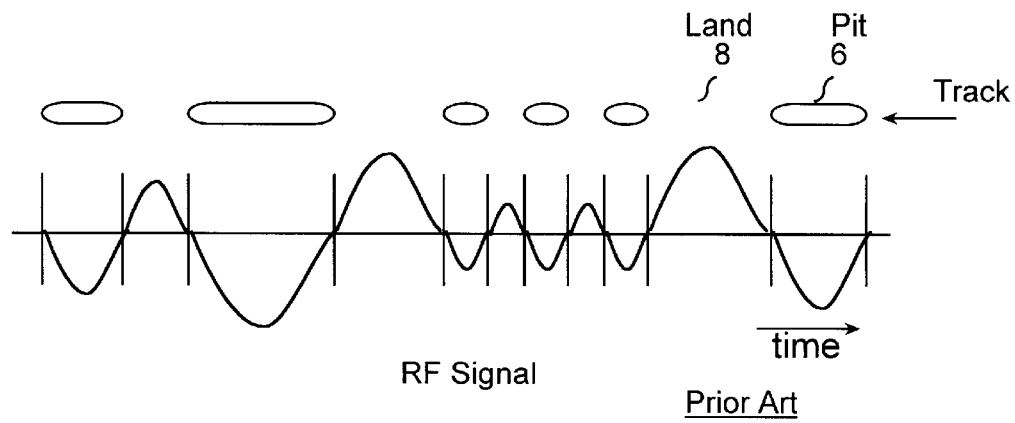
FIG. 1 illustrates the relationship between an analog RF signal and the pits and lands on an optical disk.
Figure 2:
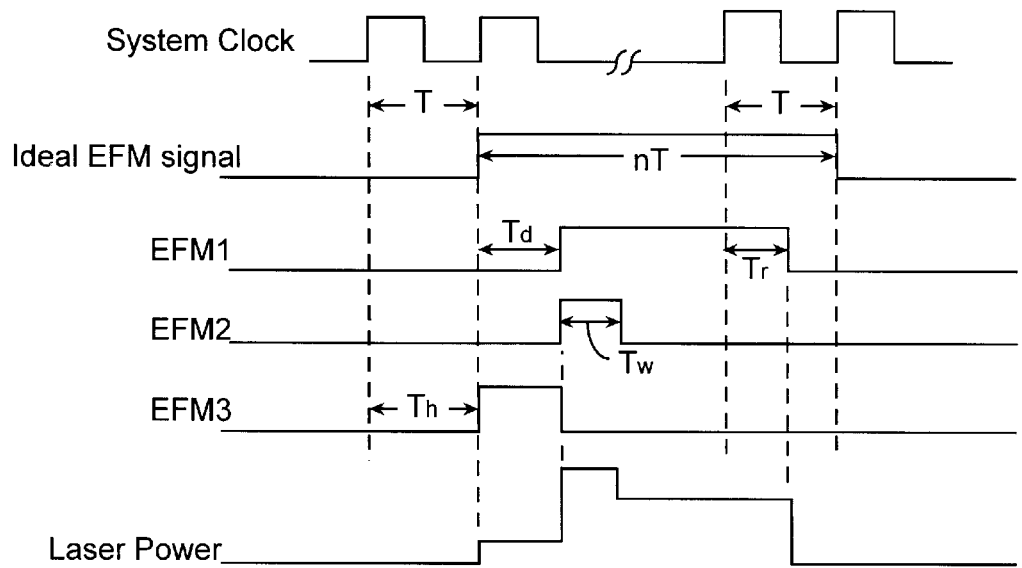
FIG. 2 is a timing diagram illustrating the relationship between an ideal EFM signal and the laser output power.
Figure 12:
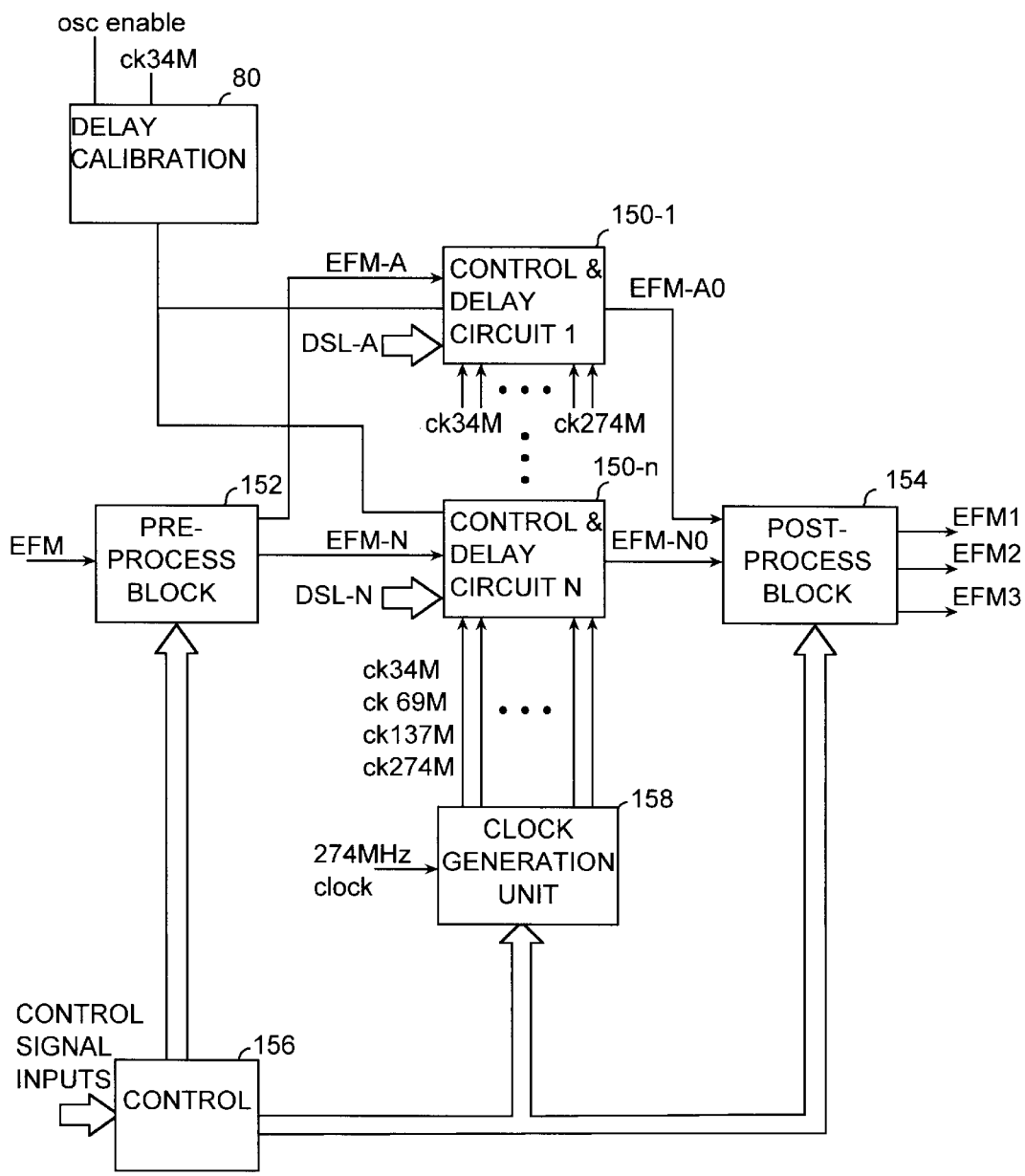
FIG. 12 illustrates an embodiment of a portion of a write strategy circuit that uses the delay circuit of the present invention.

In FIG. 12, the high precision delay circuit of the present invention is used in a write strategy circuit to generate the EFM1, EFM2 and EFM3 signals of FIG. 2. A pre-process block 152 receives an encoded EFM signal and generates intermediate EFM signals—EFM-A and EFM-N which are supplied to control and delay circuits 150. The control and delay circuits 150 output delayed EFM signals—EFM-A0 and EFM-N0 to a post-process block 154 which combines the EFM-A0 and EFM-N0 signals and generates the EFM1, EFM2 and EFM3 signals.

The delay calibration block 80 receives an oscillator enable signal and a thirty-four megahertz clock as the reference clock, and outputs the first count signal Ncount1. A single delay calibration block 80 is used with multiple gate delay blocks in the control and delay circuits 150.

A control circuit 156 controls the pre-process block 152, the control and delay circuits 150, the post-process block 156 and a clock generation circuit 158. The clock generation circuit 158 receives a 274 MHz signal and outputs a set of clock signals, including 34 MHz, 69 MHz, 137 MHz and 274 MHz.

Figure 13:
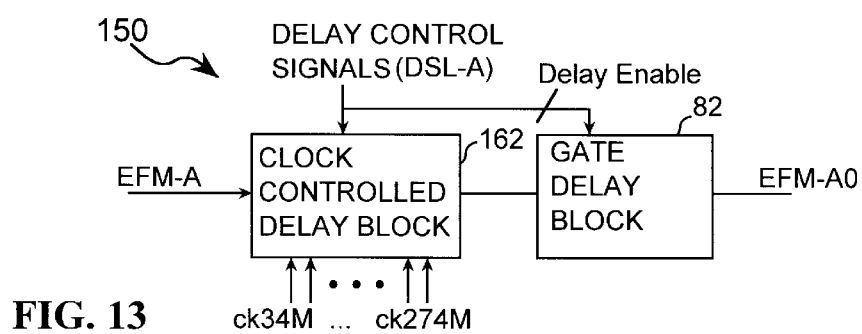
FIG. 13 illustrates an embodiment of a control and delay circuit of FIG. 12.

As shown in FIG. 13, an exemplary control and delay circuit 150 includes a clock controlled delay block 162 and the gate delay block 82. The gate delay block 82 was described above. The clock controlled delay block 162 receives the set of clock signals, an input signal and delay control signals. The clock controlled delay block 162 generates the input signal for the gate delay block 82. The gate delay block 82 operates as described above. In one implementation, five control and delay circuits 150 are used.

Therefore the circuit and method of the present invention provide a highly precise and stable delay. The amount of delay is calibrated dynamically to compensate for process, temperature and power supply variations.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A circuit for applying a high precision delay to an input signal synchronized to a system clock, comprising:

an oscillator generating oscillator pulses, each with an oscillator period;

a counter, in response to an enable signal, counting said oscillator pulses and outputting a count signal, the count signal having a plurality of bits, wherein said enable signal is a reference clock signal synchronized to the system clock and having an enabling interval that is greater than each said oscillator period;

a data latch to receive count bits representing a divided count signal and to output the divided count signal, wherein the count bits:

comprise a subset of the plurality of bits of the count signal; and represent a value corresponding to the count signal divided by a positive integer power of two;

a delay generator delaying the input signal to provide a sequence of incrementally delayed delay-signals; and a multiplexor that, in response to said divided count signal, selects one of said delay-signals that has a delay with respect to the input signal substantially equal to the enabling interval divided by $2^N$, where N is a positive integer.

2. The circuit of claim 1 wherein said oscillator is a ring oscillator having at least one ring oscillator delay block and said delay generator has at least one delay generator delay block.

3. The circuit of claim 2 wherein said ring oscillator delay block and said delay generator delay block provide substantially a same amount of delay.

4. The circuit of claim 2 wherein said ring oscillator delay block and said delay generator delay block each include at least one inverter.

5. The circuit of claim 2 wherein one ring oscillator delay block of said ring oscillator is a combinational logic gate, one input of said combinational logic gate being coupled to a control signal for enabling and disabling said generation of said oscillator pulses.

6. A disk controller comprising:

a servo system generating signals to cause an actuator to position a head over a target track on a disk, said servo system also generating at least one signal to cause a disk motor to rotate said disk;

a datapath control unit receiving write data to write to said disk from a bus and outputting a write data signal of serially encoded digital data; and a control circuit for generating a write channel signal from said write data signal, including:

an oscillator generating oscillator pulses, each with an oscillator period;

a counter, in response to an enable signal, counting said oscillator pulses and outputting a count signal, the count signal having a plurality of bits, wherein said enable signal is said write data signal having an enabling interval that is greater than each said oscillator period;

a data latch to receive count bits representing a divided count signal and to output the divided count signal, wherein the count bits:

comprise a subset of the plurality of bits of the count signal; and represent a value corresponding to the count signal divided by a positive integer power of two;

a delay generator providing a sequence of delayed write data signals; and a multiplexor that, in response to said divided count signal, selects one of said delayed write data signals that has a delay with respect to the write data signal substantially equal to the enabling interval divided by $2^N$, where N is a positive integer, to generate a write channel signal to send to said head.

7. The disk controller of claim 6 wherein said oscillator is a ring oscillator having at least one ring oscillator delay block and said delay generator has at least one delay generator delay block.

8. The disk controller of claim 7 wherein said ring oscillator delay block and said delay generator delay block provide substantially the same amount of delay.

9. The disk controller of claim 8 wherein said ring oscillator delay block and said delay generator delay block each include at least one inverter.

10. The disk controller of claim 8 wherein one ring oscillator delay block of said ring oscillator is a combinational logic gate, one input of said combinational logic gate being coupled to a control signal for enabling and disabling said generation of said oscillator pulses.

11. A method of applying a high precision delay to an input signal synchronized to a system clock, comprising:

generating oscillator pulses;

counting said oscillator pulses, during an enabling interval of a reference clock signal synchronized to the system clock, to output a count signal; wherein the enabling interval is greater than an oscillator period associated with the oscillator pulses;

generating a divided count signal corresponding to the count signal divided by a positive integer power of two;

delaying the input signal to provide a sequence of delayed signals; and selecting one of said delayed signals that has a delay with respect to the input signal substantially equal to the enabling interval divided by $2^N$ in response to said divided count signal, where N is a positive integer.

12. The method of claim 11 wherein said generating includes generating oscillator pulses in a first delay path and said delaying step includes the step of producing said delayed signals in a second delay path corresponding to said first delay path.

* * * * *